(12) United States Patent
Jiang et al.

(10) Patent No.: US 11,942,172 B2
(45) Date of Patent: Mar. 26, 2024

(54) CHIP HAVING DEBUG FUNCTION AND CHIP DEBUGGING METHOD

(71) Applicant: REALTEK SEMICONDUCTOR CORPORATION, Hsinchu (TW)

(72) Inventors: Pan-Ting Jiang, Suzhou (CN); Zan Li, Suzhou (CN)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 85 days.

(21) Appl. No.: 17/899,006

(22) Filed: Aug. 30, 2022

(65) Prior Publication Data
US 2023/0187007 A1   Jun. 15, 2023

(30) Foreign Application Priority Data
Dec. 9, 2021   (CN) .......................... 202111497897.X

(51) Int. Cl.
| G11C 29/14 | (2006.01) |
| G11C 29/08 | (2006.01) |
| G11C 29/18 | (2006.01) |

(52) U.S. Cl.
CPC .............. *G11C 29/14* (2013.01); *G11C 29/08* (2013.01); *G11C 29/18* (2013.01); *G11C 2029/1802* (2013.01)

(58) Field of Classification Search
CPC ................. G11C 29/14; G11C 29/08
See application file for complete search history.

(56) References Cited

U.S. PATENT DOCUMENTS

| 2006/0036827 A1* | 2/2006 | Dell ...................... G06F 11/201 711/115 |
| 2014/0181364 A1* | 6/2014 | Berke ................. G06F 13/1673 711/103 |

FOREIGN PATENT DOCUMENTS

| CN | 103164789 A | 6/2013 |
| CN | 104991845 B | 10/2018 |

OTHER PUBLICATIONS

Valentin Gherman, Samuel Evain, Bastien Giraud; Binary linear ECCs optimized for bit inversion in memories with asymmetric error probabilities; DATE 2020-2020 Design, Automation & Test in Europe Conference & Exhibition, IEEE, Mar. 2020, Grenoble, France (Year: 2020).*

* cited by examiner

Primary Examiner — Joseph D Torres
(74) Attorney, Agent, or Firm — WPAT, P.C

(57) ABSTRACT

A chip having a debug function includes functional circuitries, a selector circuitry, a data reconstruction circuitry, and a switching circuitry. Each functional circuitry includes a decoder circuit that stores a corresponding set of debug signals and outputs a corresponding debug signal in the corresponding set of debug signals to be a corresponding signal in first signals according to a corresponding address signal in address signals. The selector circuitry selects second signals from the first signals according to the address signals. The data reconstruction circuitry selects first data from the second signals according to split signals and outputs the same to be debug data. Each first data is partial data of a corresponding signal in the second signals. The switching circuitry determines whether to output the debug data or at least one output signal associated with the functional circuitries via output ports according to switching signals.

20 Claims, 11 Drawing Sheets

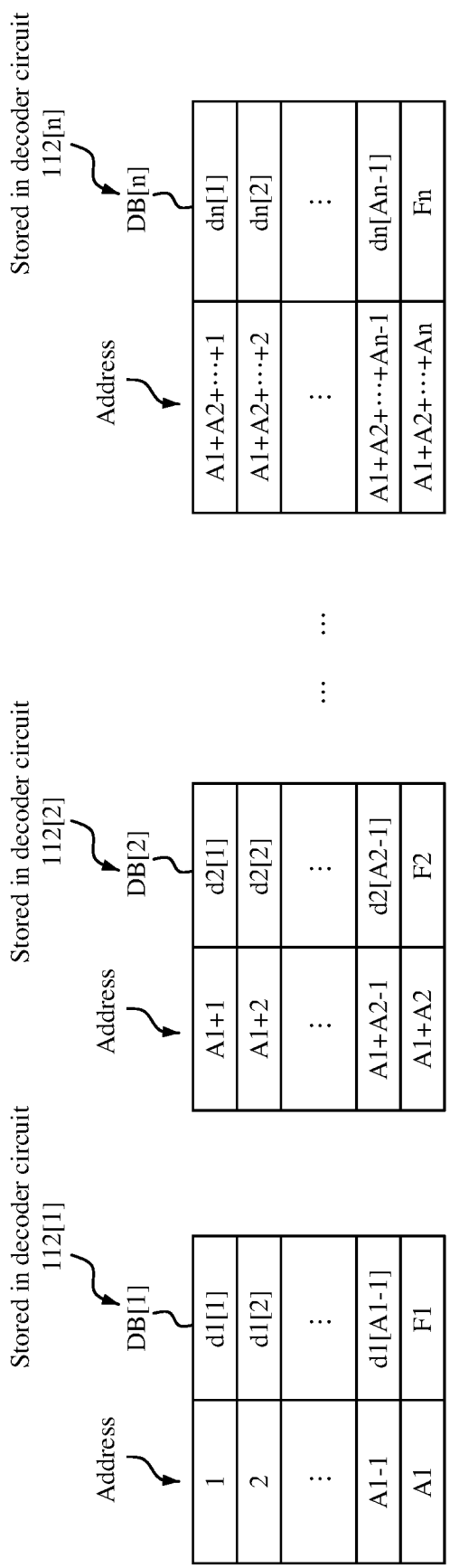
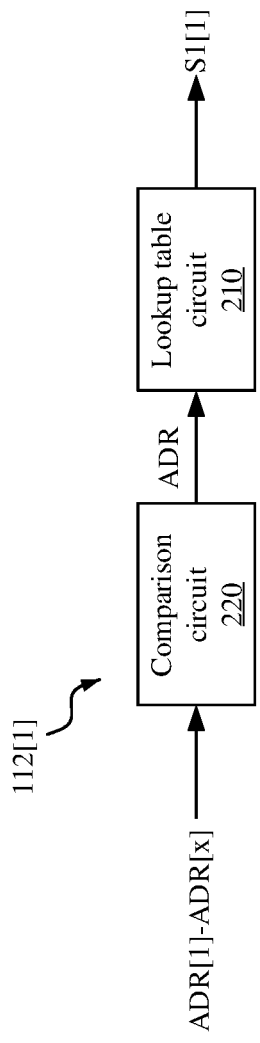
Fig. 2A
Fig. 2B

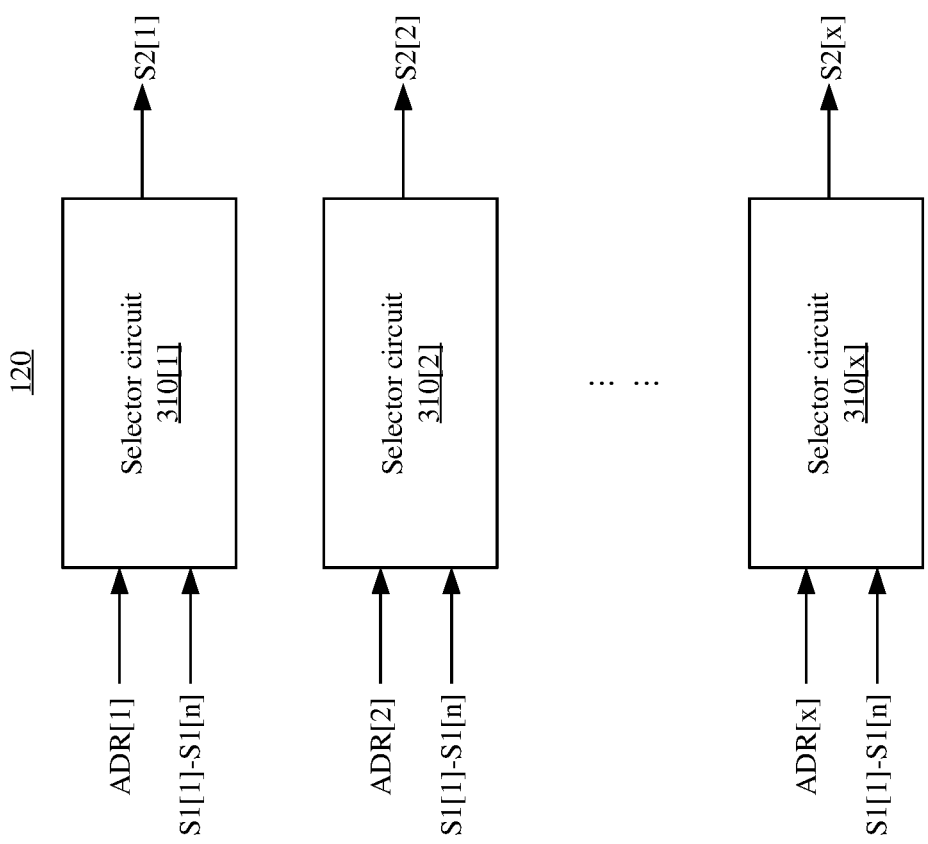

CHIP HAVING DEBUG FUNCTION AND CHIP DEBUGGING METHOD

BACKGROUND OF THE INVENTION

1. Field of the Invention

The present disclosure relates to a chip having debug function, especially to a chip able to selectively output debug signals from different circuitries and a chip debugging method thereof.

2. Description of Related Art

To ensure that a chip meets design requirements, certain important signals in the chip are outputted to be a set of debug signals via output port(s) of the chip, and the set of debug signals can be read by at least one external tool. Accordingly, whether there is an error in the chip can be verified according to the set of debug signals, in order to determine whether to adjust the chip design. With the development of technology, the number of circuits in the chip is increasing. If there are more debug signals of circuits are required to be read, the number of output ports are required to be more. However, in practical applications, the number of output ports is usually insufficient to output debug signals from a large number of circuits, which results in higher difficulty of chip testing.

SUMMARY OF THE INVENTION

In some aspects, an object of the present disclosure is, but is not limited to, to provide a chip that is able to selectively output debug signals from different circuitries and a chip debugging method thereof.

In some aspects, a chip having a debug function includes functional circuitries, a selector circuitry, a data reconstruction circuitry, and a switching circuitry. The functional circuitries are configured to respectively generate sets of debug signals, in which each of the functional circuitries includes a decoder circuit configured to store a corresponding set of debug signals in the sets of debug signals and output a corresponding debug signal in the corresponding set of debug signals to be a corresponding signal in first signals according to a corresponding address signal in address signals. The selector circuitry is configured to select second signals from the first signals according to the address signals. The data reconstruction circuitry is configured to select first data from the second signals according to split signals and output the first data to be first debug data, in which each of the first data is partial data of a corresponding signal in the second signals. The switching circuitry is configured to determine whether to output the first debug data or at least one output signal associated with the functional circuitries via output ports according to switching signals.

In some aspects, a chip debugging method includes the following operations: outputting a plurality of first signals in a plurality of sets of debug signals according to a plurality of address signals, wherein the plurality of sets of debug signals are respectively generated from a plurality of functional circuitries in a chip; selecting a plurality of second signals from the plurality of first signals according to the plurality of address signals; selecting a plurality of first data from the plurality of second signals according to a plurality of split signals and outputting the plurality of first data to be first debug data, in which each of the plurality of first data is partial data of a corresponding signal of the plurality of second signals; and determining whether to output the first debug data or at least one output signal associated with the plurality of functional circuitries via a plurality of output ports of the chip according to a plurality of switching signals.

These and other objectives of the present disclosure will no doubt become obvious to those of ordinary skill in the art after reading the following detailed description of the preferred embodiments that are illustrated in the various figures and drawings.

BRIEF DESCRIPTION OF THE DRAWINGS

FIG. 2A illustrates a corresponding relation among the decoder circuits and the sets of debug signals in FIG. 1 according to some embodiments of the present disclosure.

FIG. 2B illustrates a schematic diagram of the decoder circuit in FIG. 1 according to some embodiments of the present disclosure.

FIG. 3A illustrates a schematic diagram of the selector circuitry in FIG. 1 according to some embodiments of the present disclosure.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
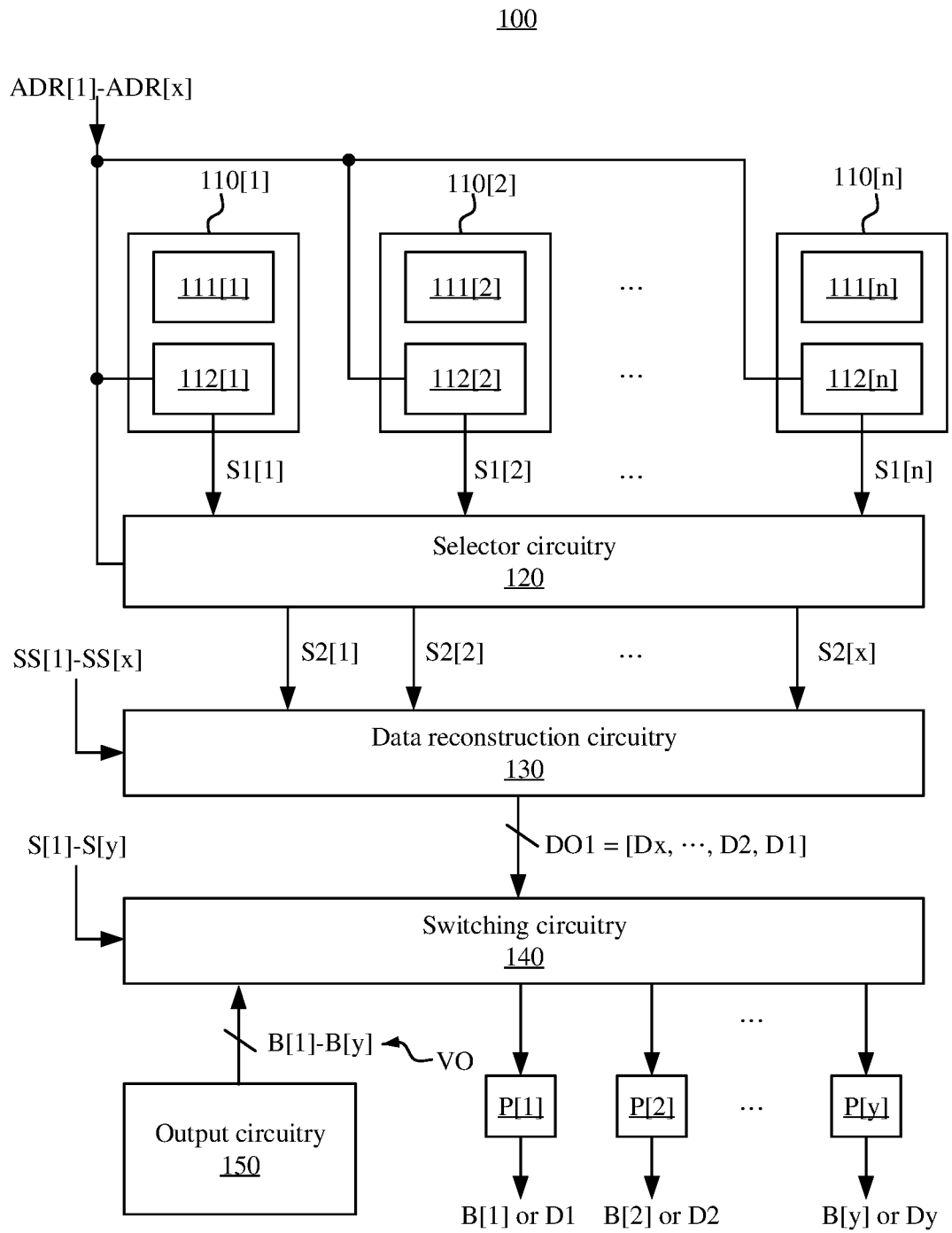
FIG. 1 illustrates a schematic diagram of a chip according to some embodiments of the present disclosure.

FIG. 1 illustrates a schematic diagram of a chip 100 according to some embodiments of the present disclosure. In some embodiments, the chip 100 may be an application specific integrated circuit having a debug function. With the debug function, the chip 100 may select internal signal(s) of different circuitries in the chip 100, in order to perform a function verification and/or circuit testing.

The chip 100 includes functional circuitries 110[1]-110[$n$], a selector circuitry 120, a data reconstruction circuitry 130, a switching circuitry 140, and an output circuitry 150. The functional circuitries 110[1]-110[$n$] may generate sets of debug signals (e.g., the sets of debug signals DB[1]-DB[$n$] in FIG. 2A) respectively. In greater detail, each of the functional circuitries 110[1]-110[$n$] includes a corresponding one of functional circuits 111[1]-111[$n$] and a corresponding one of decoder circuits 112[1]-112[$n$]. For example, the functional circuitry 110[1] includes the functional circuit 111[1] and the decoder circuit 112[1], and the functional circuitry 110[2] includes the functional circuit 111[2] and the decoder circuit 112[2]. With this analogy, the corresponding relations among the functional circuitries 110[1]-110[$n$], the functional circuits 111[1]-111[$n$], and the decoder circuits 112[1]-112[$n$] can be understood.

According to different applications, the functional circuits 111[1]-111[$n$] may respectively perform predetermined functions (which may be, for example but not limited to, analog/digital signal processing, image processing, depth learning, communication, and so on). Each of the decoder circuits 112[1]-112[$n$] may be configured to store a set of debug signals generated when a corresponding one of the functional circuits 111[1]-111[$n$] performs the predetermined function, and to output a corresponding debug signal in the set of debug signals to be a corresponding one of the first signals S1[1]-S1[$n$] according to a corresponding address signal in the address signals ADR[1]-ADR[x]. In some embodiments, the debug signals may be, but not limited to, internal signals of the functional circuits 111[1]-111[$n$] when the functional circuits 111[1]-111[$n$] operate. In some embodiments, the value n and the value x are positive integers, and n is higher than x.

For example, the decoder circuit 112[1] may store a set of debug signals (e.g., a first set of debug signals DB[1] in FIG. 2A) generated when the functional circuit 111[1] performs the predetermined function, and output a corresponding debug signal in the set of debug signals to be a first signal S1[1] according to a corresponding address signal in the address signals ADR[1]-ADR[x]. With this analogy, it is understood that the decoder circuit 112[$n$] may store a set of debug signals (e.g., a n-th set of debug signals DB[$n$] in FIG. 2A) generated by the functional circuit 111[$n$] when the functional circuit 111[$n$] performs the predetermined function, and output a corresponding debug signal in the set of debug signals to be a first signal S1[$n$] according to a corresponding address signal in the address signals ADR[1]-ADR[x].

The selector circuitry 120 may be configured to select second signals S2[1]-S2[$x$] from the first signals S1[1]-S1[$n$] according to the address signals ADR[1]-ADR[x]. With the selector circuitry 120, unwanted signals in the first signals S1[1]-S1[$n$] can be removed, and remaining signals in the first signals S1[1]-S1[$n$] can be outputted to be the second signals S2[1]-S2[x].

The data reconstruction circuitry 130 may be configured to select first data D1-Dx from the second signals S2[1]-S2[$x$] according to split signals SS[1]-SS[x], and output the data D1-Dx to be first debug data DO1. Operations about the data reconstruction circuitry 130 will be described with reference to FIG. 4A and FIG. 4B.

The switching circuitry 140 is coupled between the data reconstruction circuitry 130 and the output circuitry 150. The output circuitry 150 may transmit at least one output signal VO associated with the functional circuitries 110[1]-110[$n$] (which includes bits B[1]-B[y]). In some embodiments, the value y may be a product of a value x and a value p. The at least one output signal VO may be a signal generated from the predetermined function that is performed by at least one of the functional circuitries 110[1]-110[$n$]. The switching circuitry 140 may determine whether to output one corresponding data in the first debug data DO1 or a corresponding one of the bits B[1]-B[y] via output ports P[1]-P[y] of the chip 100 (which may be, for example but not limited to, input/output pads) according to the switching signals S[1]-S[y]. With the above arrangements, the debug signal(s) and normal signal(s) (e.g., the at least one output signal VO) of the chip 100 may share the output ports P[1]-P[y]. As a result, the chip 100 may output the debug signal(s) without using additional output port(s), in order to verify whether the chip 100 is working correctly. Operations of the switching circuitry 140 will be described with reference to FIG. 5.

FIG. 2A illustrates a corresponding relation among the decoder circuits 112[1]-112[$n$] and the sets of debug signals DB[1]-DB[$n$] in FIG. 1 according to some embodiments of the present disclosure. As shown in FIG. 2A, the decoder circuits 112[1]-112[$n$] respectively store the sets of debug signals DB[1]-DB[$n$], which correspond to address ranges that are sequentially increased. For example, the decoder circuit 112[1] stores a first set of debug signals DB[1], and the corresponding address range is from address 1 to address A1. The decoder circuit 112[2] stores a second set of debug signals DB[2], and the corresponding address range is from address A1+1 to address A1+A2. With this analogy, it is understood that the decoder circuit 112[$n$] stores a n-th set of debug signals DB[$n$], and the corresponding address range is from A1+A2+ . . . +1 to address A1+A2+ . . . +An.

Figure 4A:
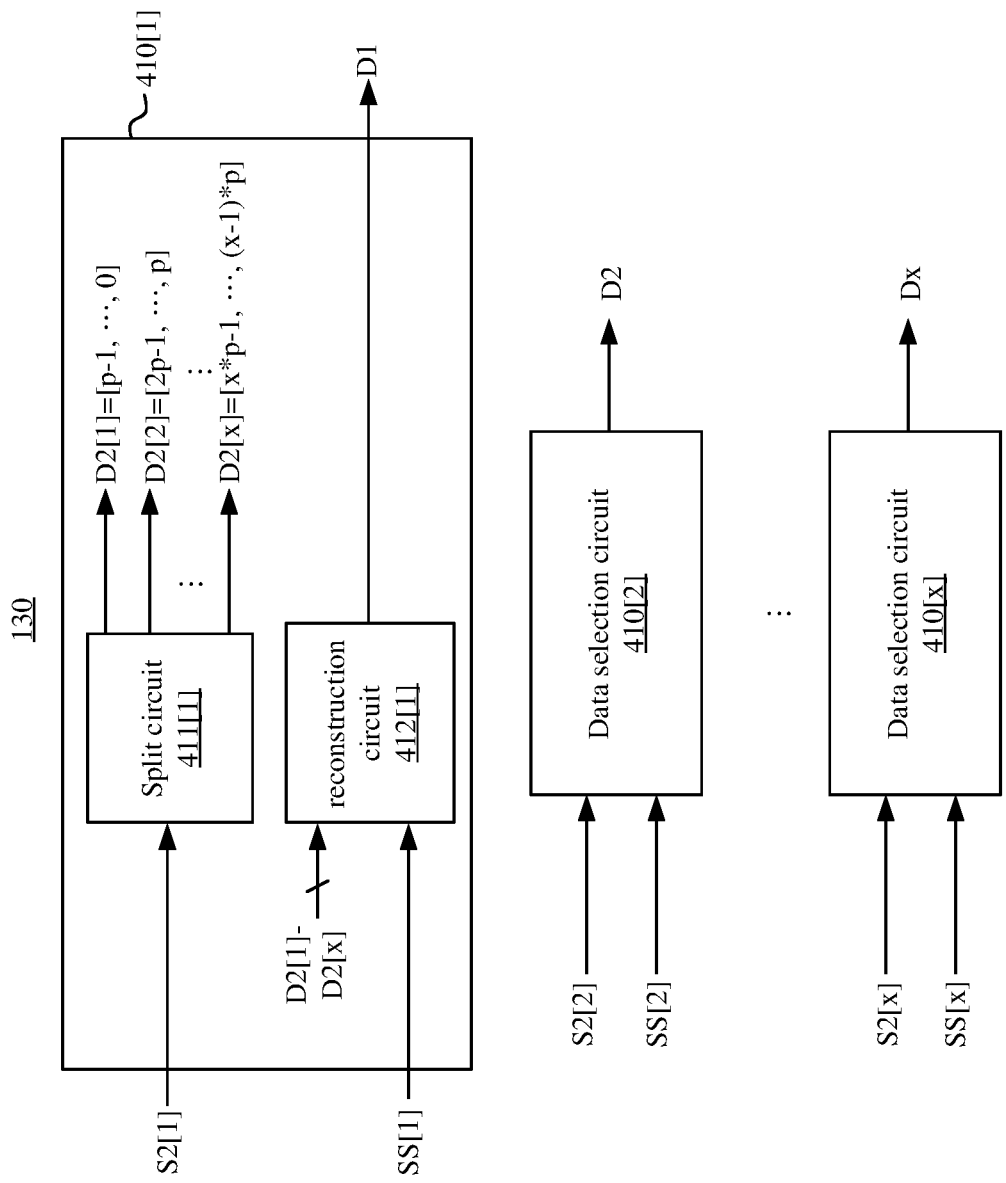
FIG. 4A illustrates a schematic diagram of the data reconstruction circuitry according to some embodiments of the present disclosure.

Each of the sets of debug signals DB[1]-DB[$n$] includes debug signals and a predetermined flag value, and each of the debug signals has the same number of bits (which may be, for example, x*p bits as shown in FIG. 4A). For example, the first set of debug signals DB[1] includes debug signals d1[1]-d1[A1−1] and a predetermined flag value F1, which sequentially correspond to addresses 1 to A1. The second set of debug signals DB[2] includes debug signals d2[1]-d2[A2−1] and a predetermined flag value F2, which sequentially correspond to addresses A1+1 to A1+A2. With this analogy, it is understood that the n-th set of debug signals DB[$n$] includes debug signals dn[1]-dn[An−1] and a predetermined flag value Fn, which sequentially correspond to addresses A1+A2+ ... +1 to A1+A2+ ... +An. The predetermined flag values F1-Fn are predetermined values, which may be utilized to verify whether debug function (e.g., operations of the decoder circuits 111[2]-112[n], the data reconstruction circuitry 130, and the switching circuitry 140) is working correctly.

Figure 2C:
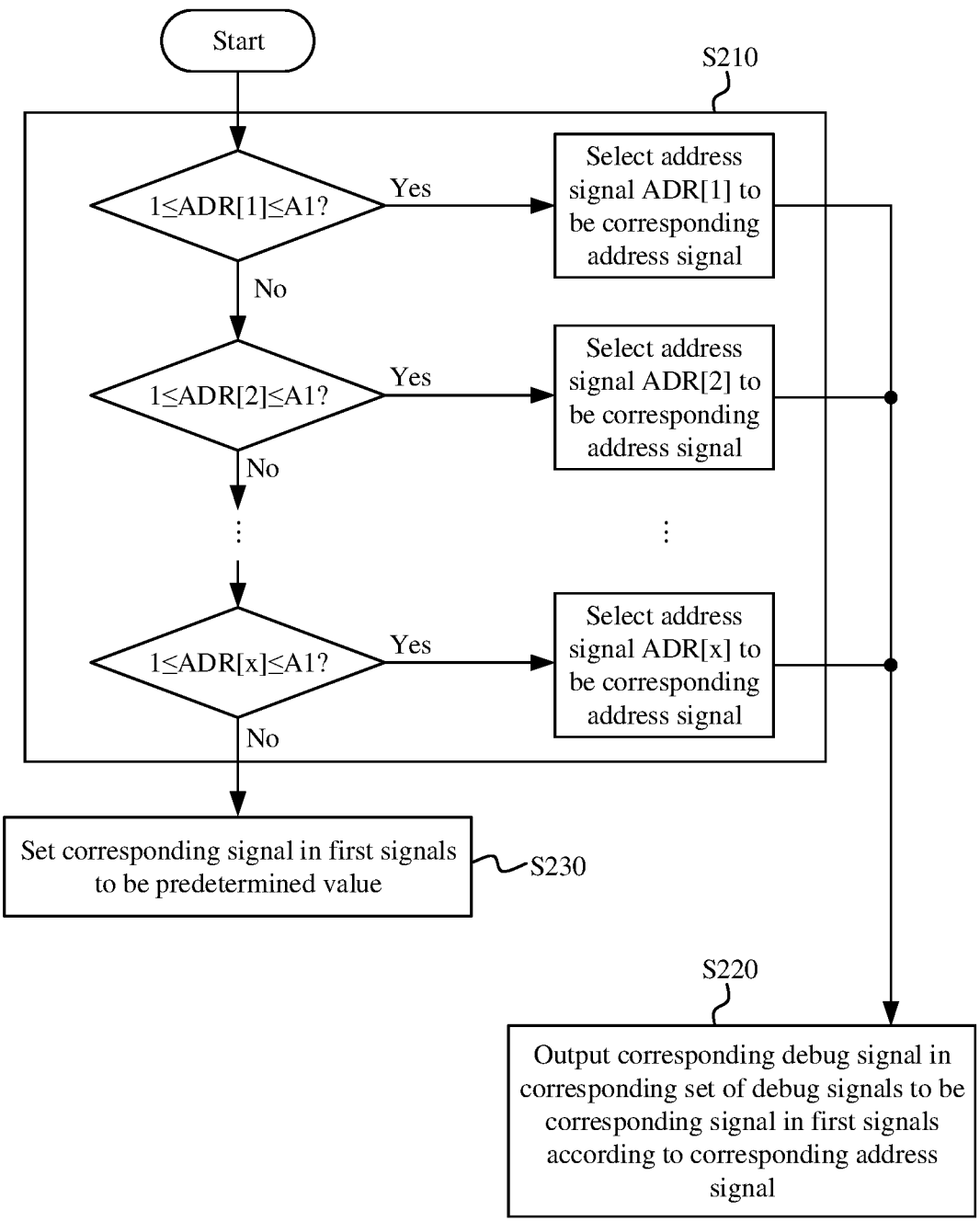
FIG. 2C illustrates a flow chart of operations performed by the decoder circuit in FIG. 2B according to some embodiments of the present disclosure.

FIG. 2B illustrates a schematic diagram of the decoder circuit 112[1] in FIG. 1 according to some embodiments of the present disclosure. Each of the decoder circuits 112[1]-112[n] in FIG. 1 has the same circuit architecture. Taking the decoder circuit 112[1] as an example, the decoder circuit 112[1] includes a lookup table circuit 210 and a comparison circuit 220. The lookup table circuit 210 may be configured to store the first set of debug signals in FIG. 2A and store the corresponding relation between the first set of debug signals DB[1] and addresses 1 to A1. For example, the lookup table circuit 210 may be a memory circuit or a register circuit, which may be configured to store a lookup table that indicates a corresponding relation between addresses 1 to A1 and both debug signals d1[1]-d1[A1–1] and the predetermined value F1. The comparison circuit 220 may be configured to sequentially determine whether the address signals ADR[1]-ADR[x] meet a corresponding address range in the address ranges (e.g., address 1 to address A1), in order to select a corresponding one of the address signals ADR[1]-ADR[x] to be a corresponding address signal ADR. As a result, the lookup table circuit 210 may output a corresponding debug signal in the first set of debug signals DB[1] to be the first signal S1[1] according to the corresponding address signal ADR. In some embodiments, the comparison circuit 220 may be implemented with at least one digital logic circuit that performs partial operations (e.g., operation S210 and operation S230) in FIG. 2C.

FIG. 2C illustrates a flow chart of operations performed by the decoder circuit 112[1] in FIG. 2B according to some embodiments of the present disclosure. In operation S210, the address signals (e.g., the address signals ADR[1]-ADR[x]) are sequentially compared with the corresponding address range (for example, the corresponding address range of the decoder circuit 112[1] is address 1 to address A1), in order to select a corresponding address signal (e.g., the corresponding address signal ADR) that matches up to the corresponding address range). If the corresponding address signal is selected, operation S220 is performed. Alternatively, if no corresponding address signal is selected, operation S230 is performed.

For example, as shown in FIG. 2C, the comparison circuit 220 may compare the address signal ADR[1] with the corresponding address range (i.e., address 1 to address A1). If the address signal ADR[1] matches up to the corresponding address range (i.e., the address signal ADR[1] is higher than or equal to address 1 and is lower than or equal to address A1), the comparison circuit 220 may determine that the address signal ADR[1] matches up to the corresponding address range, in order to output the address signal ADR[1] to be the corresponding address signal ADR. Alternatively, if the address signal ADR[1] does not match up to the corresponding address range, the comparison circuit 220 may determine that the address signal ADR[1] does not match up to the corresponding address range, and start comparing the address signal ADR[2] with the corresponding address range. With this analogy, the comparison circuit 220 is able to find out a signal in the address signals ADR[1]-ADR[x] that matches up to the corresponding address range, and output the signal to be the corresponding address signal ADR.

In operation S220, a corresponding debug signal in the set of debug signals (e.g., the first set of debug signals DB[1] in FIG. 2A) is outputted to be a corresponding signal in the first signals (e.g., the first signal S1[1]).

For example, if the value of the address signal ADR[1] equals to address 1, the comparison circuit 220 may determine that the address signal ADR[1] matches up to the corresponding address range and output the address signal ADR[1] to be the corresponding address signal ADR. The lookup table circuit 210 may output the debug signal d1[1] corresponding to address 1 to be the first signal S1[1] according to the corresponding address signal ADR. With this analogy, if the value of the address signal ADR[1] is equal to the address A1, the comparison circuit 220 may determine whether the corresponding signal ADR[1] matches up to the corresponding address A1 and output the address signal ADR[1] to be the corresponding address signal ADR. With this analogy, if the value of the address signal ADR[1] is the same as address A1, the comparison circuit 220 may determine that the address signal ADR[1] matches up to the corresponding range, and output the address signal ADR[1] to be the corresponding address signal ADR. The lookup table circuit 210 outputs the predetermined flag value F1 corresponding to address A1 to be the first signal S1[1] according to the corresponding address signal.

In operation S230, the corresponding signal in the first signals is set to be a predetermined value. If all the address signals ADR[1]-ADR[x] do not match up to the corresponding address range, the comparison circuit 220 may set the first signals S1[1] to be a predetermined value (which may be but not limited to 0), in order to indicate that the address signals ADR[1]-ADR[x] do not match up to the address range of the decoder circuit 112[1].

With the above operations, the decoder circuit 112[1] may output a specific debug signal to be the first signal S1[1] according to the address signals ADR[1]-ADR[x]. As a result, a user may freely select debug signal(s) to be observed by setting the address signals ADR[1]-ADR[x]. For example, during an initial phase, a user may set the value of the address signal ADR[1] to be the value A1, such that the decoder circuit 112[1] outputs the predetermined flag value F1 to be the corresponding first signal S1[1]. As a result, the user may utilize external tool(s) (which may be, but not limited to, an oscilloscope, a logic analyzer, and so on) to verify whether the decoder circuit 112[1] outputs the first signal S1[1] correctly. If the first signal S1[1] is the predetermined flag value F1, it indicates that the decoder circuit 112[1] is able to correctly output the predetermined flag value F1 to be the first signal S1[1]. If the first signal S1[1] is not the predetermined flag value F1, it indicates that the decoder circuit 112[1] cannot output the predetermined flag value F1 to be the first signal S1[1] correctly. Under this condition, it indicates at least one of the selector circuitry 120, the data reconstruction circuitry 130, and the switching circuitry 140) may be failure. With this analogy, the user may utilize the address signals ADR[1]-ADR[x] and the predetermined flag values F1-Fn to check whether the debug function is working correctly.

FIG. 3A illustrates a schematic diagram of the selector circuitry 120 in FIG. 1 according to some embodiments of the present disclosure. In some embodiments, the selector circuitry 120 includes selector circuits 310[1]-310[x]. Each of the selector circuits 310[1]-310[x] receives a corresponding one of the address signals ADR[1]-ADR[x] and the first signals S1[1]-S1[n], and compares the corresponding one of the address signals ADR[1]-ADR[x] with the address ranges, in order to select a corresponding one of the second signals S2[1]-S2[x] from the first signals S1[1]-S1[n].

For example, the selector circuit 310[1] may receive the address signal ADR[1] and the first signals S1[1]-S1[n], and sequentially compare the address signal ADR[1] with the address ranges, in order to select the second signal S2[1] from the first signals S1[1]-S1[n]. The selector circuit 310[2] may receive the address signal ADR[2] and the first signals S1[1]-S1[n], and sequentially compare the address signal ADR[2] with the address ranges, in order to select the second signal S2[2] from the first signals S1[1]-S1[n]. With this analogy, the corresponding relation among the selector circuits 310[1]-310[x], the address signals ADR[1]-ADR[x], and the second signals S2[1]-S2[x] can be understood. In some embodiments, each of the selector circuits 310[1]-310[x] has the same circuit architecture. For example, each of the selector circuits 310[1]-310[x] may be, but not limited to, implemented with at least one digital logic circuit that performs operations in FIG. 3B.

Figure 3B:
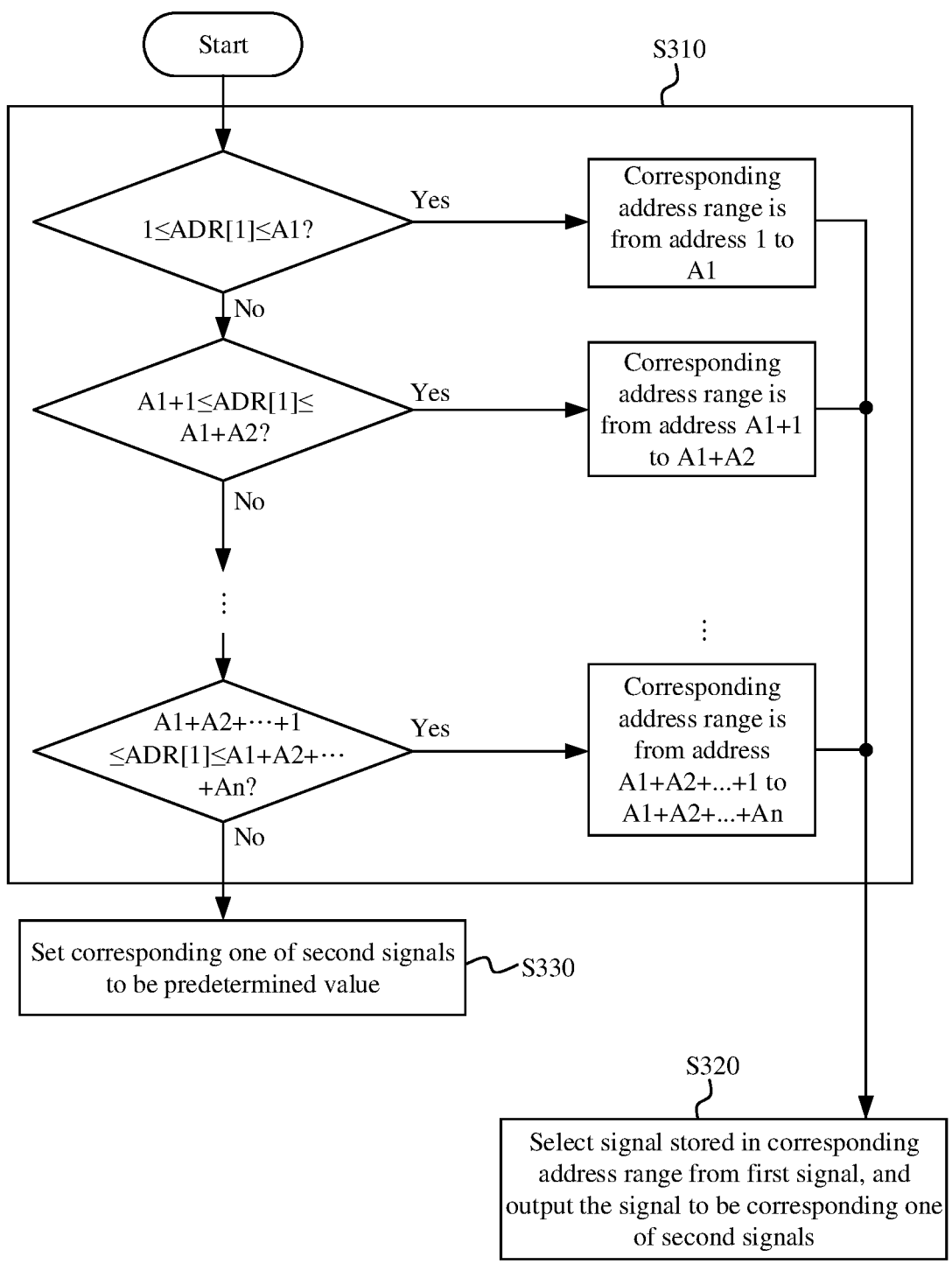
FIG. 3B illustrates a flow chart of operations performed by the selector circuit in FIG. 3A according to some embodiments of the present disclosure.

FIG. 3B illustrates a flow chart of operations performed by the selector circuit 310[1] in FIG. 3A according to some embodiments of the present disclosure. In operation S310, the received address signal (which is the address signal ADR[1] in view of the selector circuit 310[1]) is sequentially compared with the address ranges (e.g., address 1 to address A1, address A1+1 to address A1+A2, . . . , and address A1+A2+ . . . +1 to address A1+A2+ . . . +An), in order to select a corresponding address range that matches up to the address signal from the address ranges. If the corresponding address range is selected, operation S320 is performed. Alternatively, if no corresponding address range is selected, operation S330 is performed.

For example, as shown in FIG. 3B, the selector circuit 310[1] may compare the address signal ADR[1] with a first address range (i.e., address 1 to address A1). If the address signal ADR[1] matches up to (i.e., located within) the corresponding address range (i.e., the address signal ADR[1] is higher than or equal to the address 1 and lower than or equal to the address A1), the selector circuit 310[1] may determine that the address signal ADR[1] matches up to the first address range. Alternatively, if the address signal ADR[1] does not match up to the first address range, the selector circuit 310[1] may continue comparing the address signal ADR[1] with the second address range (i.e., address A1+1 to address A1+A2). With this analogy, the selector circuit 310[1] may find a corresponding address range in the address ranges that matches up to the address signal ADR[1].

In operation S320, a signal stored in the corresponding address range is selected from the first signals, and the signal is outputted to be a corresponding one of the second signals (which is the second signal S2[1] in view of the selector circuit 310[1]). For example, in operation S310, the selector circuit 310[1] determines that the corresponding address range that matches up to the address signal ADR[1] is the first address range (i.e., address 1 to address A1). As the first signal S1[1] is stored in the first address range (as shown in FIG. 2A), the selector circuit 310[1] outputs the first signal S1[1] to be the second signal S2[1]. Alternatively, if the selector circuit 310[1] determines that the corresponding address range that matches up to the address signal ADR[1] is the second address range (i.e., address A1+1 to address A1+A2, as the first signal S1[2] is stored in the second address range (as shown in FIG. 2A), the selector circuit 310[1] outputs the first signal S1[2] to be the second signal S2[1].

In operation S330, the corresponding one of the second signals (which is the second signal S2[1] in view of the selector circuit 310[1]) is set to be a predetermined value. For example, if the address signal ADR[1] does not match up to all address ranges, it indicates that the value of the address signal ADR[1] may be. Under this condition, the selector circuit 310[1] may set the second signal S2[1] to be a predetermined value (which may be, for example but not limited to, 0), in order to indicate that the address signal ADR[1] does not match up to all address ranges.

For ease of understanding, the above operations are illustrated using circuit 310[1] as an example. It is understood that the remaining selector circuits 310[2]-310[x] may perform the same operations according to the remaining address signals ADR[2]-ADR[x]. For example, the selector circuit 310[2] may sequentially determine a corresponding address range that matches up to the address signal ADR[2] in the address ranges, select a signal stored in the corresponding address range from the first signals S1[1]-S1[n], and output that signal to be the second signal S2[2]. Alternatively, if the address signal ADR[2] does not match up to all address ranges, the selector circuit 310[2] may set the second signal S2[2] to be the predetermined value.

With the above operations, a user may select a specific circuit to be observed from the functional circuitries 110[1]-110[n] by setting the address signals ADR[1]-ADR[x]. In other words, with the address signals ADR[1]-ADR[x] and the selector circuits 310[1]-310[x], the user may remove unwanted signals in the first signals S1[1]-S1[n].

FIG. 4A illustrates a schematic diagram of the data reconstruction circuitry 130 according to some embodiments of the present disclosure. In some embodiments, the data reconstruction circuitry 130 includes data selection circuits 410[1]-410[x]. Each of the data selection circuits 410[1]-410[x] is configured to split a corresponding one of the second signals S2[1]-S2[x] into multiple second data and to select one corresponding data from the second data to be a corresponding one of first data D1-Dx according to a corresponding one of split signals SS[1]-SS[x].

In some embodiments, each of the data selection circuits 410[1]-410[x] has the same circuit architecture. Taking the data selection circuit 410[1] as an example, the data selection circuit 410[1] includes a split circuit 411[1] and a reconstruction circuit 412[1]. The split circuit 411[1] receives the second signal S2[1] and splits the second signal S2[1] into second data D2[1]-D2[x]. As mentioned above, all debug signals in the sets of debug signals DB[1]-DB[n] have the same number of bits. As a result, each of the first signals S1[1]-S1[n] and each of the second signals S2[1]-S2[x] have the same number of bits as well. If the number of bits of each debug signal is x*p (the value x and the value p are positive integers), the split circuit 411[1] may split the second signal S2[1] into x second data D2[1]-D2[x], in which each of the second data D2[1]-D2[x] is p-bit data. For example, if the data of the second signal S2[1] is [x*p−1, . . . , (x−1)*p, . . . , 2p−1, . . . , p, p−1, . . . , 0], the second data D2[1] may be [p−1, . . . , 0], the second data D2[2] may be [2p−1, . . . , p], and the second data D2[x] may be [x*p−1, . . . , (x−1)*p]. The reconstruction circuit 412[1] may select a corresponding data from the second data D2[1]-D2[x] to be the first data D1 according to the split signal SS[1].

With this analogy, it is understood, the corresponding relation among the remaining data selection circuits 410[2]-410[x], the second signals S2[2]-S2[x], and the first data D2-Dx can be understood. For example, in the data selection circuit 410[2], the split circuit receives the second signal S2[2] and splits the second signal S2[2] into multiple second data, and the reconstruction circuit selects a corresponding data from the second data to be the first data D2 according to the split signal SS[2]. In the data selection circuit 410[x], the split circuit receives the second signal S2[x] and splits the second signal S2[x] into multiple second data, and the reconstruction circuit selects a corresponding data from the second data to be the first data Dx according to the split signal SS[x]. Accordingly, it is understood that each of the first data D1-Dx may be partial data of a corresponding signal in the second signals. Taking the first data D1 as an example, the first data D1 is partial data of the second signal S2[1] (i.e., a corresponding one of the second data D2[1]-D2[x]). With the above operations, the data selection circuits 410[1]-410[x] may output the multiple first data D1-Dx to be first debug data DO1. For example, as shown in FIG. 1, the first debug data DO1 may be expressed as: [Dx, . . . , D2, D1].

As mentioned above, in some embodiments, each of the data selection circuits 410[1]-410[x] may have the same circuit architecture. For example, each of the data selection circuits 410[1]-410[x] may be, but not limited to, implemented with at least one digital logic circuit that performs operations in FIG. 4B. In some embodiments, the split circuit 411[1] and the reconstruction circuit 412[1] may be, but not limited to, integrated into a single digital circuit, or share serval circuits.

Figure 4B:
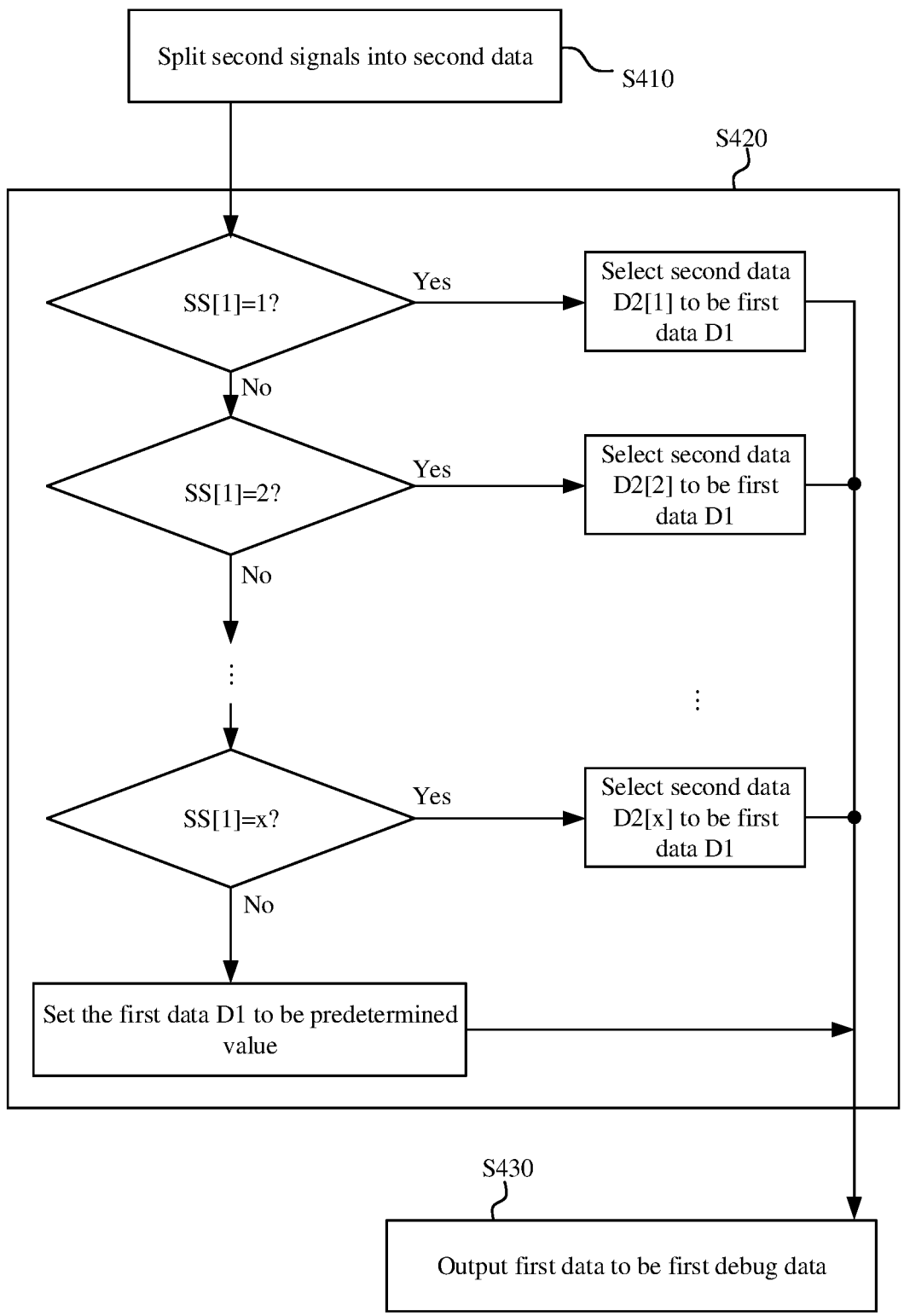
FIG. 4B illustrates a flow chart of operations performed by the data reconstruction circuitry in FIG. 4A according to some embodiments of the present disclosure.

FIG. 4B illustrates a flow chart of operations performed by the data reconstruction circuitry 130 in FIG. 4A according to some embodiments of the present disclosure. In operation S410, the second signals are spitted into second data (e.g., the second data D2[1]-D2[x]). As mentioned above, the split circuit 411[1] may split the second signal S2[1] into the second data D2[1]-D2[x]. With this analogy, the remaining data selection circuits 410[2]-410[x] may respectively split the remaining second signals S2[2]-S2[n] into the second data.

In operation S420, a corresponding one of the second data is selected to be a corresponding one of the first data according to a corresponding one of the split signals. Taking the data selection circuit 410[1] as an example, as shown in FIG. 4B, if the value of the split signal SS[1] is 1, the data selection circuit 410[1] may select the second data D2[1] from the second data D2[1]-D2[x] to be the first data D1 according to the split signal SS[1]. If the value of the split signal SS[1] is 2, the split circuit 411[1] may select the second data D2[2] from the second data D2[1]-D2[x] to be the first data D1 according to the split signal SS[1]. With this analogy, if the value of the split signal SS[1] is x, the data selection circuit 410[1] may select the second data D2[x] from the second data D2[1]-D2[x] to be the first data D1 according to the split signal SS[1]. Alternatively, if the value of the split signal SS[1] is not equal to any value from 1-x, the split circuit 411[1] may set the first data D1 to be a predetermined value (which may be, but not limited to, 0). Similarly, the data selection circuit 410[2] may select one data from the second data D2[1]-D2[x] to be the first data D2 according to the split signal SS[2], and the data selection circuit 410[x] may select one data from the second data D2[1]-D2[x] to be the first data Dx according to the split signal SS[x].

In operation S430, the first data are outputted to be the first debug data. For example, as shown in FIG. 4A, the data selection circuits 410[1]-410[x] may output the selected first data D1-Dx to be the first debug data DO1.

With the above function, the required data can be selected from each of the second signals S2[1]-S2[x] by setting values of the split signals SS[1]-SS[x], and the selected data are reconstructed (or recombined) to be the first debug data DO1. As a result, a user is able to acquire debug signals from x circuitries in the functional circuitries 110[1]-110[n] of the chip 100 via an external tool.

Figure 5:
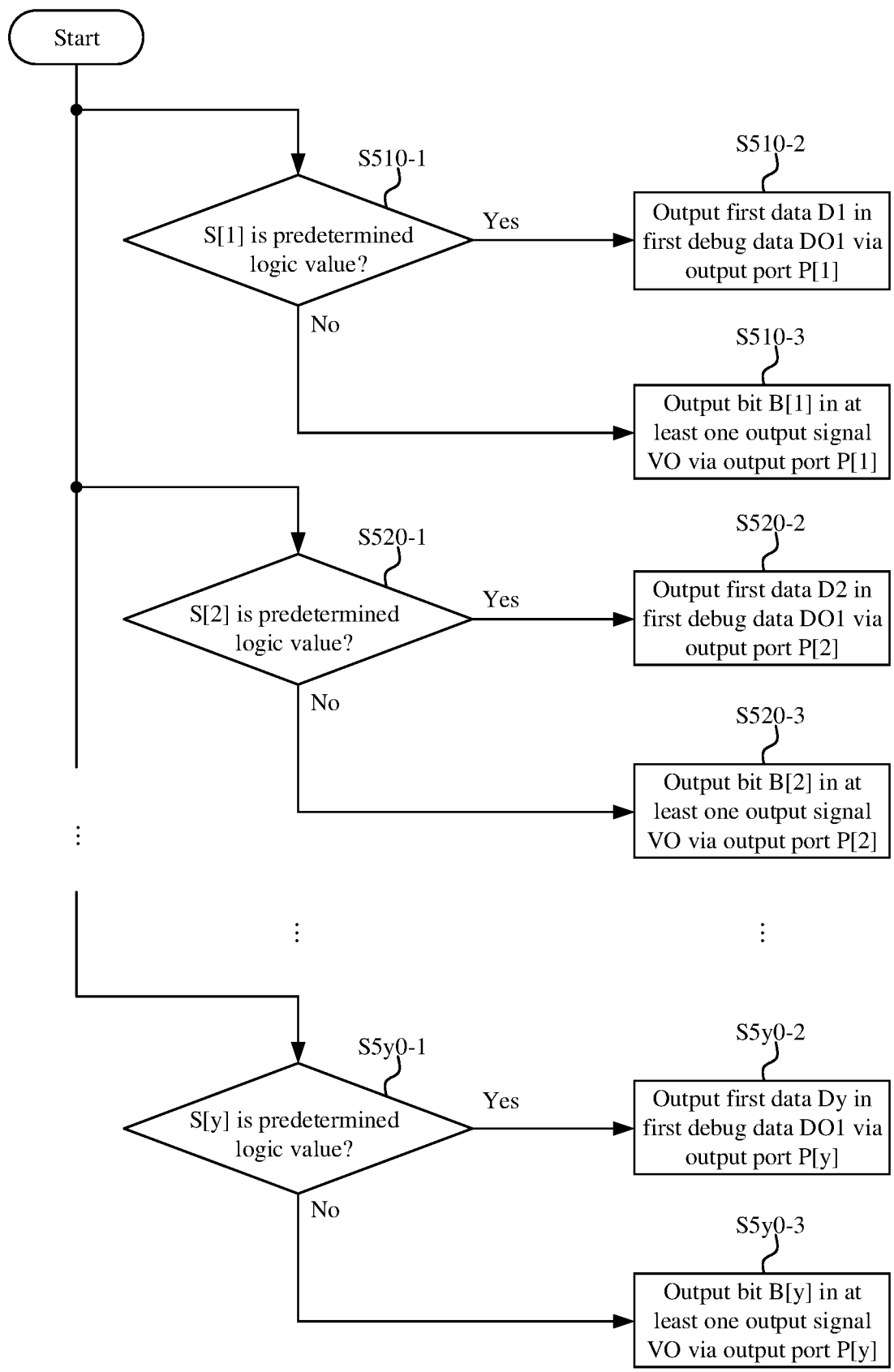
FIG. 5 illustrates a flow chart of operations performed by the switching circuitry in FIG. 1 according to some embodiments of the present disclosure.

FIG. 5 illustrates a flow chart of operations performed by the switching circuitry 140 in FIG. 1 according to some embodiments of the present disclosure. In some embodiments, the switching circuitry 140 may be, but not limited to, implemented with at least one digital logic circuit and/or at least one switch circuit that perform(s) operations in FIG. 5.

In operation S510-1, whether the switching signal S[1] is a predetermined logic value (which may be, for example and not limited to, a logic value of 1) is determined. If the switching signal S[1] is the predetermined logic value, operation S510-2 is performed. If the switching signal S[1] is not the predetermined logic value, operation S510-3 is performed. In operation S510-2, first data D1 in the first debug data DO1 is outputted via the output port P[1]. In operation S510-3, the bit B[1] in the at least one output signal VO is outputted via the output port P[1].

Similarly, in operation S520-1, whether the switching signal S[2] is the predetermined logic value is determined. If the switching signal S[2] is the predetermined logic value, operation S520-2 is performed. If the switching signal S[2] is not the predetermined logic value, operation S520-3 is performed. In operation S520-2, the first data D2 in the first debug data DO1 is outputted via the output port P[2]. In operation S520-3, the bit B[2] of the at least one output signal VO is outputted via the output port P[2].

With this analogy, in operation S5y0-1, whether the switching signal S[y] is the predetermined logic value is determined. If the switching signal S[y] is the predetermined logic value, operation S5y0-2 is performed. If the switching signal S[y] is not the predetermined logic value, operation S5y0-3 is performed. In operation S5y0-2, the first data Dy in the first debug data DO1 is outputted via the output port P[y]. In operation S5y0-3, the bit B[y] of the at least one output signal VO is outputted via the output port P[y].

In other words, each of the output ports P[1]-P[y] of the chip 100 may be controlled by a corresponding one of the switching signals S[1]-S[y]. When the corresponding one of the switching signals S[1]-S[y] has the predetermined logic value, the switching circuitry 140 may output a corresponding data of the first debug data DO1 via a corresponding output port in the output ports P[1]-P[y]. Alternatively, when the corresponding one of the switching signals S[1]-S[y] does not have the predetermined logic value, the switching circuitry 140 may output a corresponding bit in the at least one output signal VO via the corresponding output port. With the above arrangement, the chip 100 may output the debug signal(s) without utilizing additional output ports, in order to verify whether he chip 100 is working correctly.

Figure 6A:
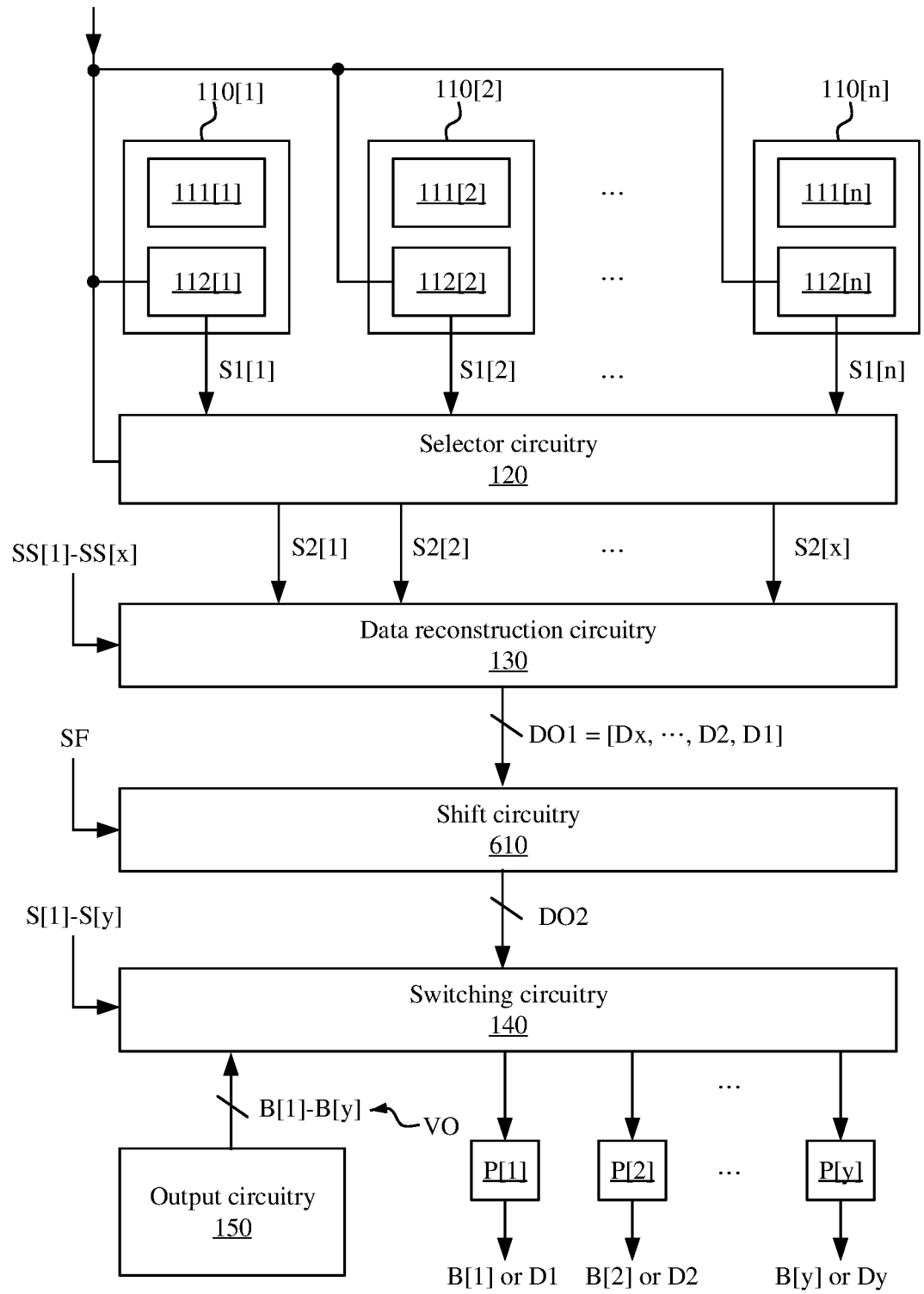
FIG. 6A illustrates a schematic diagram of a chip according to some embodiments of the present disclosure.

FIG. 6A illustrates a schematic diagram of a chip 600 according to some embodiments of the present disclosure. Compared with FIG. 1, in this example, the chip 600 further includes a shift circuitry 610. The shift circuitry 610 is coupled between the data reconstruction circuitry 130 and the switching circuitry 140 and configured to selectively perform a bit-shift operation on the first debug data DO2 according to a shift signal SF, in order to generate second debug data DO2. In some embodiments, the shift signal SF is to indicate a number of bits being shifted in the first debug data DO1. If an output port in the output ports is failure, or if the number of the output ports is insufficient, the shift signal SF can be set to perform bit-shift operation on the multiple first data D1-Dx in the first debug data DO1, in order to output a signal to be observed or an important signal in the first data D1-Dx to be data in the second debug data DO2 via the limited number of output ports. As a result, it can assure that the debug signal to be observed can be obtained correctly, in order to verify whether there is an error in the chip 600. In some embodiments, the shift circuitry 610 may be, but not limited to, implemented with at least one digital logic circuit and/or a shift register circuit that perform(s) operations in FIG. 6B.

Figure 6B:
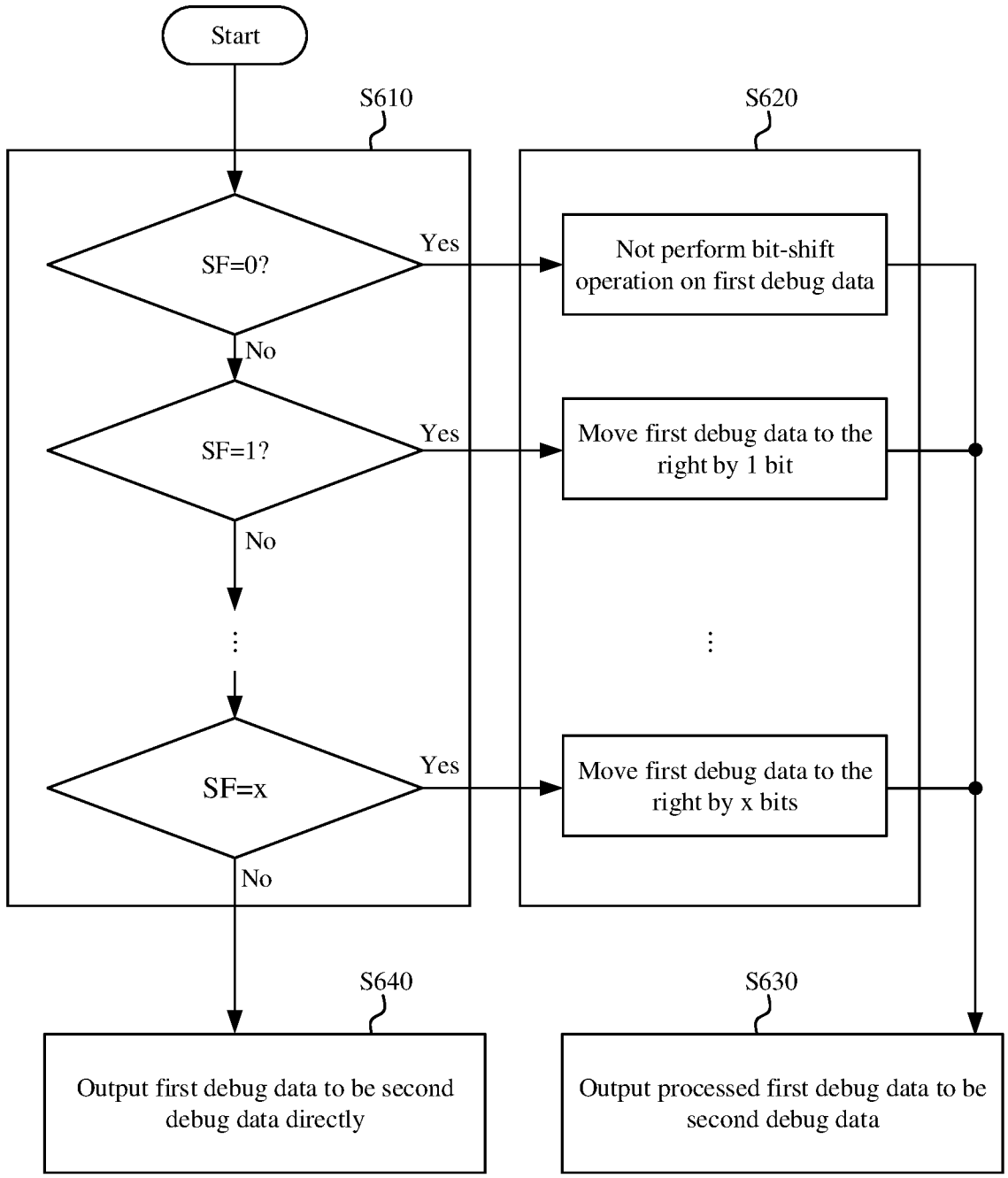
FIG. 6B illustrates a flow chart of operations performed by the shift circuitry in FIG. 6A according to some embodiments of the present disclosure.

FIG. 6B illustrates a flow chart of operations performed by the shift circuitry 610 in FIG. 6A according to some embodiments of the present disclosure. In operation S610, a value that matches up to the shift signal is determined. If the value that matches up to the shift signal is obtained, operation S620 is performed. Alternatively, if no value that matches up to the shift signal is obtained, operation S640 is performed. In operation S620, the bit-shift operation is performed on the first debug data according to the value that matches up to the shift signal. In operation S630, the processed first debug data are outputted to be the second debug data. In operation S640, the first debug data are directly outputted to be the second debug data.

For example, the shift circuitry 610 may sequentially determine whether the shift signal SF is equal to one of the values 0-x, in order to obtain the value that matches up to the shift signal SF. If the shift signal SF is equal to 0, the shift circuitry 610 may determine that the value that matches up to the shift signal SF is 0. If the shift signal SF is equal to 1, the shift circuitry 610 may determine that the value that matches up to the shift signal SF is 1. With this analogy, if the shift signal SF is equal to x, the shift circuitry 610 may determine that the value that matches up to the shift signal SF is x.

Afterwards, the shift circuitry 610 may move bits in the multiple first data D1-Dx of the first debug data DO1 to the right according to the value that matches up to the shift signal SF. For example, if the value that matches up to the shift signal SF is 0, the shift circuitry 610 does not shift bits in the first debug data DO1 to the right. Under this condition, the first debug data DO1 may be expressed as [Dx, Dx-1, . . . , D2, D1] (as shown in FIG. 6A), and the shift circuitry 610 may output the first debug data DO1 to be the second debug data DO2. Alternatively, if the value that matches up to the shift signal SF is 1, the shift circuitry 610 may move the first debug data DO1 to the right by one bit. Under this condition, the first debug data DO1 after being shifted to the right can be expressed as [D1, Dx, Dx-1, . . . , D2], and the shift circuitry 601 may output the shifted first debug data DO1 to be the second debug data DO2. With this analogy, if the value that matches up to the shift signal SF is x, the shift circuitry 610 may move the first debug data DO1 to the right by x bits. Under this condition, the first debug data DO1 after being shifted to the right can be expressed as [Dx-1, . . . , D2, D1, Dx], and the shift circuitry 601 may output the shifted first debug data DO1 to be the second debug data DO2.

Alternatively, if the shift circuitry 610 determines that the shift signal SF is not equal to any one from values 1-x, it indicates that the shift signal SF may be incorrect. Under this condition, the shift circuitry 610 does not move the first debug data DO1 to the right, and thus the first debug data DO1 is still expressed as [Dx, Dx-1, . . . , D2, D1]. The shift circuitry 610 may directly output the first debug data DO1 to be the second debug data DO2. The above examples are illustrated with right shift, but the present disclosure is not limited thereto. In different embodiments, the shift circuitry 610 may be configured to move the first debug data DO1 to the left.

In each of the above embodiments, the address signals ADR[1]-ADR[x], the split signals SS[1]-SS[x], the switching signals S[1]-S[y], and/or the shift signal SF may be stored in at least one register circuit (not shown) in the chip 100 (or the chip 600). A user may set values of the address signals ADR[1]-ADR[X], the split signals SS[1]-SS[x], the switching signals S[1]-S[y], and/or the shift signal SF by external tool(s) and/or field programmable gate array (FPGA), in order to obtain debug signal(s) to be observed from the chip 100 (or the chip 600).

Figure 7:
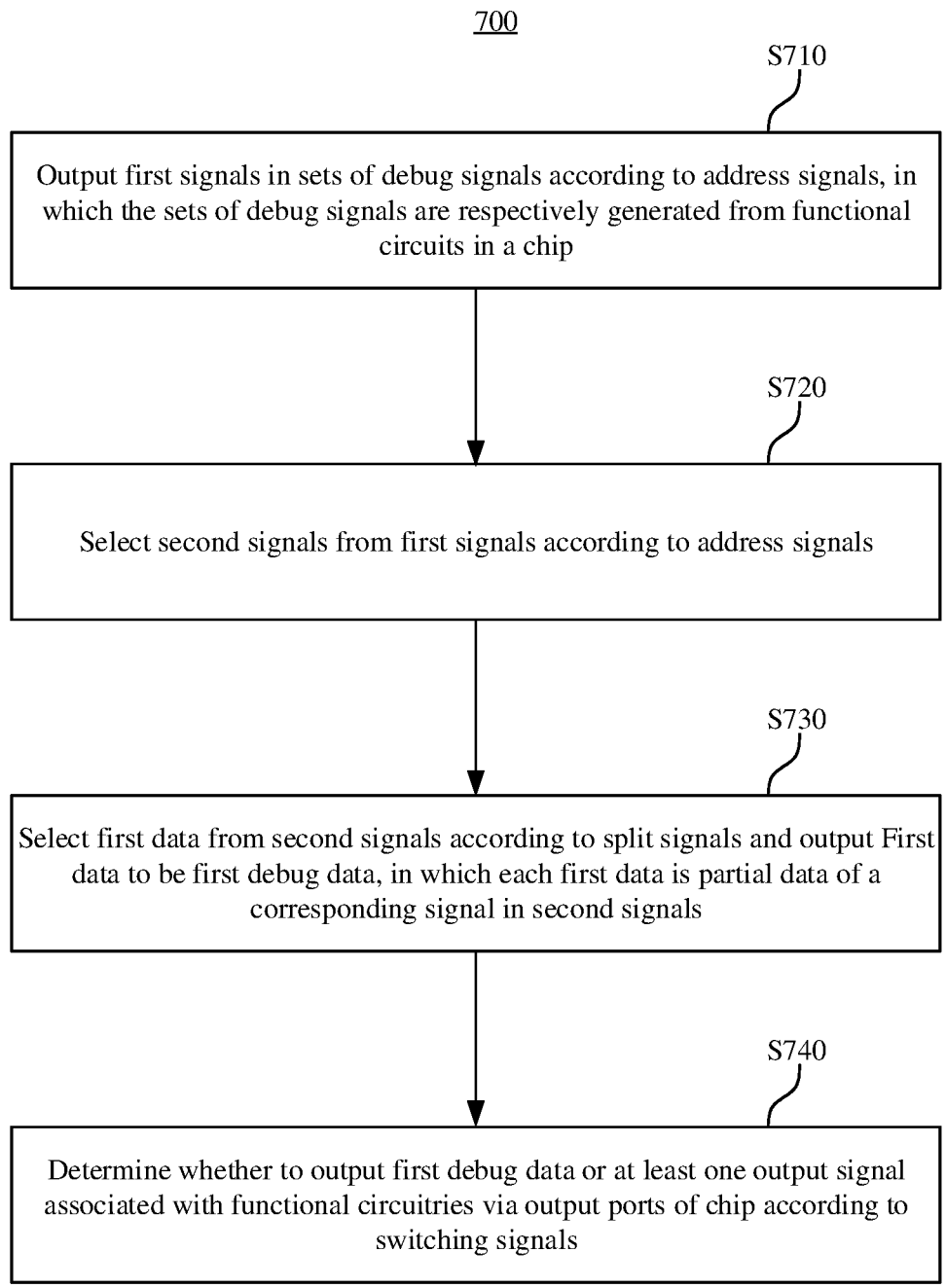
FIG. 7 illustrates a flow chart of a chip debugging method according to some embodiments of the present disclosure.

FIG. 7 illustrates a flow chart of a chip debugging method according to some embodiments of the present disclosure. In operation S710, first signals in sets of debug signals are outputted according to address signals, in which the sets of debug signals are respectively generated from functional circuits in a chip. In operation S720, second signals are selected from the first signals according to the address signals. In operation S730, first data are selected from the second signals according to split signals and are outputted to be first debug data, in which each of the first data is partial data of a corresponding signal in the second signals. In operation S740, whether to output the first debug data or at least one output signal associated with the functional circuitries via output ports of the chip are determined according to switching signals.

The above operations can be understood with reference to the above embodiments, and thus the repetitious descriptions are not further given. With the above operations, a user may selectively obtain debug signal(s) from different circuitries of the chip and may analyze the debug signals through an oscilloscope or a logic analyzer to identify the error source in the chip. As a result, it is able to read out a large number of debug signals without using additional output port(s), in order to improve the efficiency of chip verification.

The above description of FIG. 2C, FIG. 3B, FIG. 4B, FIG. 5, FIG. 6, and/or FIG. 7 may include exemplary operations, but the operations shown in FIG. 2C, FIG. 3B, FIG. 4B, FIG. 5, FIG. 6, and/or FIG. 7 are not necessarily performed in the order described above. Operations shown in FIG. 2C, FIG. 3B, FIG. 4B, FIG. 5, FIG. 6, and/or FIG. 7 can be added, replaced, changed order, and/or eliminated, or the operations shown in FIG. 2C, FIG. 3B, FIG. 4B, FIG. 5, FIG. 6, and/or FIG. 7 can be executed simultaneously or partially simultaneously as appropriate, in accordance with the spirit and scope of various embodiments of the present disclosure.

As described above, the chip having debug function and the chip debugging method in some embodiments of the present disclosure may selectively switch the outputted debug signals under the limited number of output ports, in order to improve the efficiency of chip verification.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry.

Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A chip having debug function, comprising:
   a plurality of functional circuitries configured to respectively generate a plurality of sets of debug signals, wherein each of the plurality of functional circuitries comprises a decoder circuit configured to store a corresponding set of debug signals in the plurality of sets of debug signals and output a corresponding debug signal in the corresponding set of debug signals to be a corresponding signal in a plurality of first signals according to a corresponding address signal in a plurality of address signals;
   a selector circuitry configured to select a plurality of second signals from the plurality of first signals according to the plurality of address signals;
   a data reconstruction circuitry configured to select a plurality of first data from the plurality of second signals according to a plurality of split signals and output the plurality of first data to be first debug data, wherein each of the plurality of first data is partial data of a corresponding signal in the plurality of second signals; and
   a switching circuitry configured to determine whether to output the first debug data or at least one output signal associated with the plurality of functional circuitries via a plurality of output ports according to a plurality of switching signals.

2. The chip having debug function of claim 1, wherein all debug signals in the plurality of sets of debug signals have the same number of bits.

3. The chip having debug function of claim 1, wherein the plurality of sets of debug signals respectively correspond to a plurality of address ranges that are sequentially increased, and the decoder circuit is further configured to sequentially determine whether the plurality of address signals match up to a corresponding address range in the plurality of address ranges, in order to select the corresponding address signal.

4. The chip having debug function of claim 3, wherein if all of the plurality address signals do not match up to the plurality of address ranges, the decoder circuit is further configured to set the corresponding signal of the plurality of first signals to be a predetermined value.

5. The chip having debug function of claim 1, wherein the decoder circuit is further configured to store a predetermined flag value, and when the corresponding address signal is a predetermined address, the decoder circuit is configured to output the predetermined flag value to be the corresponding signal in the plurality of first signals, in order to verify whether the decoder circuit outputs the corresponding signal in the plurality of first signals correctly.

6. The chip having debug function of claim 1, wherein the plurality of sets of debug signals respectively correspond to a plurality of address ranges that are sequentially increased, and the selector circuitry comprises a plurality of selector circuits, and each of the plurality of selector circuits is configured to compare a corresponding one of the plurality of address signals with the plurality of address ranges, in order to select a corresponding one of the plurality of second signals.

7. The chip having debug function of claim 6, wherein each of the plurality of selector circuits is configured to compare the corresponding one of the plurality of address signals with the plurality of address ranges to select a corresponding address that matches up to the corresponding one of the plurality of address signals from the plurality of address ranges, and select a signal that is stored in the corresponding address range, in order to output the signal that is stored in the corresponding address range to be the corresponding one of the plurality of second signals.

8. The chip having debug function of claim 6, wherein if all of the plurality address ranges do not match up to the corresponding one of the plurality of address signal, each of the plurality of selector circuits is further configured to set the corresponding signal in the plurality of second signals to be a predetermined value.

9. The chip having debug function of claim 1, wherein the data reconstruction circuitry comprise a plurality of data selection circuits, and each of the plurality of data selection circuits is configured to split a corresponding one of the plurality of second signals into a plurality of second data, and select a corresponding one data from the plurality of second data to be a corresponding one of the plurality of first data according to a corresponding one of the plurality of split signals.

10. The chip having debug function of claim 1, wherein the switching circuitry is configured to determine whether to output a corresponding data in the first debug data or a corresponding bit in the at least one output signal via a corresponding one of the plurality of output ports according to a corresponding one of the plurality of switching signals.

11. The chip having debug function of claim 1, further comprising:
   a shift circuitry configured to selectively perform a bit-shift operation on the first debug data according to a shift signal, in order to generate second debug data;
   wherein the switching circuitry is further configured to determine whether to output a corresponding data in the second debug data or a corresponding bit in the at least one output signal via the plurality of output ports according to the plurality of switching signals.

12. The chip having debug function of claim 11, wherein the shift signal is to indicate a number of bits to being shifted in the first debug data.

13. A chip debugging method, comprising:
   outputting a plurality of first signals in a plurality of sets of debug signals according to a plurality of address signals, wherein the plurality of sets of debug signals are respectively generated from a plurality of functional circuitries in a chip;
   selecting a plurality of second signals from the plurality of first signals according to the plurality of address signals;
   selecting a plurality of first data from the plurality of second signals according to a plurality of split signals and outputting the plurality of first data to be first debug data, wherein each of the plurality of first data is partial data of a corresponding signal of the plurality of second signals; and
   determining whether to output the first debug data or at least one output signal associated with the plurality of functional circuitries via a plurality of output ports of the chip according to a plurality of switching signals.

14. The chip debugging method of claim 13, wherein all debug signals in the plurality of sets of debug signals have the same number of bits.

15. The chip debugging method of claim 13, wherein the plurality of sets of debug signals respectively correspond to a plurality of address ranges that are sequentially increased, and outputting the plurality of first signals in the plurality of sets of debug signals according to the plurality of address signals comprises:
   sequentially determining whether the plurality of address signals match up to a corresponding address range in the plurality of address ranges, in order to select the corresponding address signal; and
   outputting a corresponding debug signal in a corresponding set of debug signals of the plurality of sets of debug signals to be a corresponding signal in the plurality of first signals according to the corresponding address signal.

16. The chip debugging method of claim 13, wherein the plurality of sets of debug signals respectively correspond to a plurality of address ranges that are sequentially increased, and selecting the plurality of second signals from the plurality of first signals according to the plurality of address signals comprises:
   comparing a corresponding one of the plurality of address signals with the plurality of address ranges, in order to select a corresponding one of the plurality of second signals.

17. The chip debugging method of claim 13, wherein selecting the plurality of first data from the plurality of second signals according to the plurality of split signals and outputting the plurality of first data to be the first debug data comprises:
   splitting a corresponding one of the plurality of second signals into a plurality of second data; and
   selecting a corresponding one data from the plurality of second data to be a corresponding one of the plurality of first data according to a corresponding one of the plurality of split signals.

18. The chip debugging method of claim 13, wherein determining whether to output the first debug data or the at least one output signal associated with the plurality of functional circuitries via the plurality of output ports of the chip according to the plurality of switching signals comprises:
   determining whether to output a corresponding data in the first debug data or a corresponding bit in the at least one output signal via a corresponding one of the plurality of output ports according to a corresponding one of the plurality of switching signals.

19. The chip debugging method of claim 13, further comprising:
   selectively perform a bit-shift operation on the first debug data according to a shift signal, in order to generate second debug data,
   wherein the second debug data is selectively outputted via the plurality of output ports.

20. The chip debugging method of claim 19, wherein the shift signal is to indicate a number of bits to being shifted in the first debug data.

* * * * *